United States Patent
Liu et al.

(10) Patent No.: US 10,446,801 B2
(45) Date of Patent: Oct. 15, 2019

(54) UV PRETREATMENT APPARATUS USED IN VACUUM EVAPORATION

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Zhaosong Liu, Guangdong (CN); Yuan-jun Hsu, Guangdong (CN); Jangsoon Im, Guangdong (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/735,207
(22) PCT Filed: Nov. 2, 2017
(86) PCT No.: PCT/CN2017/109106
§ 371 (c)(1),
(2) Date: Dec. 11, 2017
(87) PCT Pub. No.: WO2019/071669
PCT Pub. Date: Apr. 18, 2019

(65) Prior Publication Data
US 2019/0109301 A1 Apr. 11, 2019

(30) Foreign Application Priority Data
Oct. 9, 2017 (CN) .......................... 2017 1 0927479

(51) Int. Cl.
*H01L 51/56* (2006.01)
*H01L 51/00* (2006.01)
(Continued)

(52) U.S. Cl.
CPC .............. *H01L 51/56* (2013.01); *C23C 14/02* (2013.01); *C23C 14/24* (2013.01);
(Continued)

(58) Field of Classification Search
CPC . H01L 51/56; H01L 27/3262; H01L 27/3272; H01L 51/001; H01L 51/5206; C23C 14/02; C23C 14/5806
(Continued)

(56) References Cited

U.S. PATENT DOCUMENTS

2003/0184631 A1* 10/2003 Suzuki .................. B41J 11/002
347/102
2014/0317906 A1 10/2014 Lo et al.
(Continued)

FOREIGN PATENT DOCUMENTS

| CN | 103217836 A | 7/2013 |
| CN | 103602132 A | 2/2014 |

(Continued)

*Primary Examiner* — Nicole M Ippolito
(74) *Attorney, Agent, or Firm* — Soroker Agmon Nordman

(57) ABSTRACT

A ultraviolet (UV) pretreatment apparatus used in vacuum evaporation includes a housing having a curing chamber disposed inside the housing; an inlet disposed at one end of the housing and an outlet disposed at an opposite end of the housing; and a UV source disposed in the curing chamber. A light absorption layer is disposed on inner walls of the curing chamber.

15 Claims, 1 Drawing Sheet

(51) Int. Cl.
   *H01L 51/52* (2006.01)
   *H01L 27/32* (2006.01)
   *C23C 14/02* (2006.01)
   *C23C 14/24* (2006.01)
   *C23C 14/58* (2006.01)

(52) U.S. Cl.
   CPC ...... *C23C 14/5806* (2013.01); *H01L 27/3262* (2013.01); *H01L 51/001* (2013.01); *H01L 51/5206* (2013.01); *H01L 27/3272* (2013.01)

(58) Field of Classification Search
   USPC ............................. 250/492.1, 493.1, 504 R
   See application file for complete search history.

(56) References Cited

U.S. PATENT DOCUMENTS

| | | |
|---|---|---|
| 2016/0041432 A1 | 2/2016 | Kunimatsu et al. |
| 2018/0083070 A1 | 3/2018 | Zhang et al. |

FOREIGN PATENT DOCUMENTS

| | | |
|---|---|---|
| CN | 105607371 A | 5/2016 |
| CN | 106965357 A | 7/2017 |

\* cited by examiner

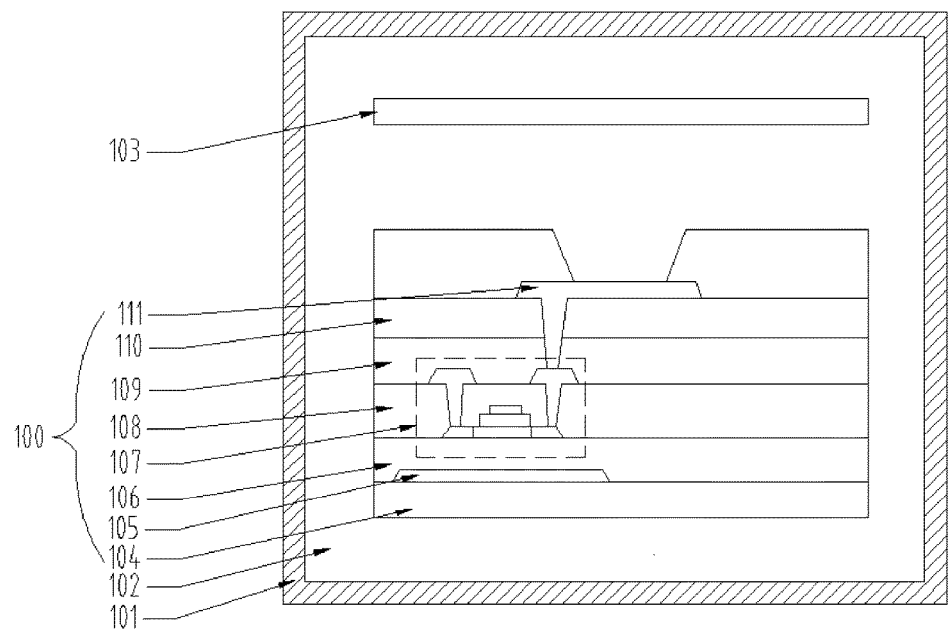

UV PRETREATMENT APPARATUS USED IN VACUUM EVAPORATION

CROSS REFERENCE TO RELATED APPLICATION

This application claims the priority of International Application No. PCT/CN2017/109106 filed on Nov. 2, 2017, which claims priority to Chinese Application No. 201710927479.7 filed on Oct. 9, 2017. The entire disclosures of each of the applications are incorporated herein by reference.

BACKGROUND

1. Field of the Disclosure

The present disclosure relates to display panel manufacture technologies, and more particularly to a ultraviolet (UV) pretreatment apparatus used in vacuum evaporation.

2. Description of Related Art

In manufacturing display panels, there is a UV treatment process performed on transparent metal portions of thin film transistor (TFT) array substrates. However, the TFTs are very sensitive to the UV treatment. Although there are light shielding layers in the TFT array substrates, electrical properties of the substrates, processed using UV, will still change a lot. The UV treatment is an inevitable pretreatment process in vacuum evaporation.

The UV treatment on the TFT array substrates in conventional skills will influence electrical properties of TFT devices of the TFT array substrates, thereby causing a decrease in quality of the TFT array substrates and affecting display panel quality.

SUMMARY

The present disclosure provides a UV pretreatment apparatus used in vacuum evaporation, capable of absorbing UV light in certain regions, thereby preventing the UV light from irradiating TFT devices of a TFT array substrate, and solving the problem of influence on electrical properties caused when the TFT devices of the TFT array substrate are irradiated by the UV light.

To solve the above problems, the technical schemes provided by the present disclosure are described below.

The present disclosure provides a ultraviolet (UV) pretreatment apparatus used in vacuum evaporation, including a housing having a curing chamber disposed inside the housing; an inlet disposed at one end of the housing and an outlet disposed at an opposite end of the housing; a UV source disposed in the curing chamber, wherein a light absorption layer is disposed on inner walls of the curing chamber; the UV source is disposed on a top face of the curing chamber and the light absorption layer is disposed on a bottom face and lateral faces of the curing chamber.

In accordance with a preferred embodiment of the present disclosure, a base is disposed in the curing chamber, the base is disposed on the bottom face of the curing chamber, and the base supports a thin film transistor (TFT) array substrate that is to be processed using UV.

In accordance with a preferred embodiment of the present disclosure, the TFT array substrate includes:
 a glass substrate;
 a light shielding pattern formed on a surface of the glass substrate;
 a buffer layer fabricated on the surface of the glass substrate and covering the light shielding pattern;
 TFT devices disposed on a surface of the buffer layer and disposed corresponding to the light shielding pattern;
 an insulating layer fabricated on the surface of the buffer layer and covering the TFT devices;
 a passivation layer fabricated on a surface of the insulating layer;
 a flattened layer fabricated on a surface of the passivation layer; and
 an anode metal pattern fabricated on a surface of the flattened layer,
 wherein the TFT array substrate is close to the UV source at one side having the anode metal pattern disposed.

In accordance with a preferred embodiment of the present disclosure, a light shielding plate is disposed in the curing chamber, the light shielding plate is parallel to the bottom face of the curing chamber, four edge portions of the light shielding plate are correspondingly attached to the lateral faces of the curing chamber, the light shielding plate includes a blocking region and a transparent region located in the blocking region, wherein a length of a first long side of the transparent region is equal to a length of a first long side of the TFT array substrate, and a length of a first short side of the transparent region is equal to a length of a first short side of the TFT array substrate.

In accordance with a preferred embodiment of the present disclosure, the lateral faces of the curing chamber are perforated to form sliding chutes, the sliding chutes are perpendicular to the bottom face of the curing chamber, fastening members matching the sliding chutes are disposed at margins of the light shielding plate, and the fastening members slidably connect to the sliding chutes.

In accordance with a preferred embodiment of the present disclosure, the light absorption layer is also disposed on a surface of the blocking region of the light shielding plate.

In accordance with a preferred embodiment of the present disclosure, an extending plate that is movable to the transparent region is disposed on a surface of the blocking region of the light shielding plate.

In accordance with a preferred embodiment of the present disclosure, one end of the extending plate is hinged at a margin of the blocking region of the light shielding plate.

In accordance with a preferred embodiment of the present disclosure, the light absorption layer is fabricated by carbon nanotubes.

The present disclosure further provides a ultraviolet (UV) pretreatment apparatus used in vacuum evaporation, including a housing having a curing chamber disposed inside the housing; an inlet disposed at one end of the housing and an outlet disposed at an opposite end of the housing; a UV source disposed in the curing chamber, wherein a light absorption layer is disposed on inner walls of the curing chamber.

In accordance with a preferred embodiment of the present disclosure, a base is disposed in the curing chamber, the base is disposed on the bottom face of the curing chamber, and the base supports a thin film transistor (TFT) array substrate that is to be processed using UV.

In accordance with a preferred embodiment of the present disclosure, the TFT array substrate includes:
 a glass substrate;
 a light shielding pattern formed on a surface of the glass substrate;

a buffer layer fabricated on the surface of the glass substrate and covering the light shielding pattern;

TFT devices disposed on a surface of the buffer layer and disposed corresponding to the light shielding pattern;

an insulating layer fabricated on the surface of the buffer layer and covering the TFT devices;

a passivation layer fabricated on a surface of the insulating layer;

a flattened layer fabricated on a surface of the passivation layer; and an anode metal pattern fabricated on a surface of the flattened layer, wherein the TFT array substrate is close to the UV source at one side having the anode metal pattern disposed.

In accordance with a preferred embodiment of the present disclosure, a light shielding plate is disposed in the curing chamber, the light shielding plate is parallel to the bottom face of the curing chamber, four edge portions of the light shielding plate are correspondingly attached to the lateral faces of the curing chamber, the light shielding plate includes a blocking region and a transparent region located in the blocking region, wherein a length of a first long side of the transparent region is equal to a length of a first long side of the TFT array substrate, and a length of a first short side of the transparent region is equal to a length of a first short side of the TFT array substrate.

In accordance with a preferred embodiment of the present disclosure, the lateral faces of the curing chamber are perforated to form sliding chutes, the sliding chutes are perpendicular to the bottom face of the curing chamber, fastening members matching the sliding chutes are disposed at margins of the light shielding plate, and the fastening members slidably connect to the sliding chutes.

In accordance with a preferred embodiment of the present disclosure, the light absorption layer is also disposed on a surface of the blocking region of the light shielding plate.

In accordance with a preferred embodiment of the present disclosure, an extending plate that is movable to the transparent region is disposed on a surface of the blocking region of the light shielding plate.

In accordance with a preferred embodiment of the present disclosure, one end of the extending plate is hinged at a margin of the blocking region of the light shielding plate.

In accordance with a preferred embodiment of the present disclosure, the light absorption layer is fabricated by carbon nanotubes.

In the UV pretreatment apparatus provided in the present disclosure, the light absorption layer is disposed on the inner walls of the chamber of the UV pretreatment apparatus to absorb a part of the UV light. This prevents the UV light from reflecting to the TFT devices of the TFT array substrate via the inner walls of the chamber. Irradiation on the TFT devices by the UV light is avoided. This ensures that electrical properties of the TFT devices will not be affected. In conventional skills, UV treatment on the TFT array substrates will exert an influence on electrical properties of TFT devices of the TFT array substrates, thereby causing a decrease in quality of the TFT array substrates and affecting the quality of display panels. The present disclosure can solve this problem.

BRIEF DESCRIPTION OF DRAWINGS

For explaining the technical schemes used in the conventional skills and the embodiments of the present disclosure more clearly, the drawings to be used in the embodiments or the descriptions on the conventional skills will be briefly introduced in the following. Obviously, the drawings below are only some embodiments of the present disclosure, and those of ordinary skill in the art can further obtain other drawings according to these drawings without making any inventive effort.

FIGURE is a schematic structural diagram showing a UV pretreatment apparatus used in vacuum evaporation provided in accordance with the present disclosure.

DETAILED DESCRIPTION OF PREFERRED EMBODIMENTS

The following descriptions for the respective embodiments are specific embodiments capable of being implemented for illustrating the present disclosure with reference to the appending figures. In describing the present disclosure, spatially relative terms such as "upper", "lower", "front", "back", "left", "right", "inner", "outer", "lateral", and the like, may be used herein for ease of description as illustrated in the figures. Therefore, the spatially relative terms used herein are intended to illustrate the present disclosure for ease of understanding, but are not intended to limit the present disclosure. In the appending drawings, units with similar structures are indicated by the same reference numbers.

In conventional skills, ultraviolet (UV) treatment on thin film transistor (TFT) array substrates will exert an influence on electrical properties of TFT devices of the TFT array substrates, thereby causing a decrease in quality of the TFT array substrates and affecting quality of display panels. Embodiments of the present disclosure can solve this problem.

As shown in the FIGURE, the present disclosure provides a UV pretreatment apparatus used in vacuum evaporation. The UV pretreatment apparatus includes a housing 101 having a curing chamber 102 disposed inside the housing 101; an inlet disposed at one end of the housing 101 and an outlet disposed at an opposite end of the housing 101; and a UV source 103 disposed in the curing chamber 102. A TFT array substrate 100 that is to be processed using UV is fed into the UV pretreatment apparatus via the inlet. After UV treatment, the TFT array substrate 100 moves away from the outlet. A light absorption layer is disposed on inner walls of the curing chamber 102.

The housing 10 is a metal housing. The curing chamber 102 includes a top face, a bottom face, and four lateral faces. The UV source 103 is disposed on the top face of the curing chamber 102. The TFT array substrate 100 is disposed on the bottom face of the curing chamber 102. The light absorption layer can be disposed only on the bottom face and the four lateral faces of the curing chamber 102. In such a way, this can prevent UV light from reflecting to TFT devices 107 via the bottom face and the lateral faces of the curing chamber 102. The top face of the curing chamber 102 is a metal face. The UV light will reflect to the top face of the curing chamber 102 after irradiating transparent metal layers of the TFT array substrate 100. The UV light reflects again and again to a surface of the TFT array substrate 100 via the top face of the curing chamber 102. This can make the most of the UV light.

The TFT array substrate 100 includes a glass substrate 104; a light shielding pattern 105 formed on a surface of the glass substrate 104; a buffer layer 106 fabricated on the surface of the glass substrate 104 and covering the light shielding pattern 105; TFT devices 107 disposed on a surface of the buffer layer 106 and disposed corresponding to the light shielding pattern 105; an insulating layer 108 fabricated on the surface of the buffer layer 106 and covering the TFT devices 107; a passivation layer 109 fabricated on a surface of the insulating layer 108; a flattened layer 110 fabricated on a surface of the passivation layer 109; and an anode metal pattern 111 fabricated on a surface of the flattened layer 110. The TFT array substrate 100 is close to the UV source 103 at one side having the anode metal pattern 111 disposed. In such a way, the insulating layer 108, the passivation layer 109, and the flattened layer 110 are located between the UV source 103 and the TFT devices 107 of the TFT array substrate 100. The protection of the plurality of film layers prevents the UV light from penetrating into the film layers to irradiate the TFT devices.

A light shielding plate is disposed in the curing chamber 102. The light shielding plate is parallel to the bottom face of the curing chamber 102. Four edge portions of the light shielding plate are correspondingly attached to the lateral faces of the curing chamber 102. The light shielding plate includes a blocking region and a transparent region located in the blocking region. A length of a first long side of the transparent region is equal to a length of a first long side of the TFT array substrate 100. A length of a first short side of the transparent region is equal to a length of a first short side of the TFT array substrate 100. The light shielding plate is added to the curing chamber 102. A size of the transparent region of the light shielding plate is equal to a size of the TFT array substrate 100. This ensures that the surface of the TFT array substrate 100 can be irradiated with the UV light normally. The blocking region of the light shielding plate is placed in a region between edges of the TFT array substrate 100 and the lateral faces of the curing chamber 102. This can shield the UV light at peripheral regions of the TFT array substrate 100, and thus prevent the UV light from reflecting to the TFT devices 107 via the lateral faces of the curing chamber 102.

The lateral faces of the curing chamber 102 are perforated to form sliding chutes. The sliding chutes are perpendicular to the bottom face of the curing chamber 102. Fastening members matching the sliding chutes are disposed at margins of the light shielding plate. The fastening members slidably connect to the sliding chutes. In such a way, the light shielding plate can move vertically in the curing chamber 102. By moving the light shielding plate, a distance between the light shielding plate and the UV source 103 can be adjusted. The less the distance between the light shielding plate and the UV source 103 is, the wider the irradiation of the UV source 103 is. In this way, it is applicable to TFT array substrates 100 of different sizes.

The light absorption layer is also disposed on a surface of the blocking region of the light shielding plate. Both of the light absorption layer disposed on the surface of the light shielding plate and the light absorption layer disposed on the inner walls of the curing chamber 102 are fabricated by carbon nanotubes. In experimentation, absorption has been proven to exceed 90% for the light absorption layer fabricated using carbon nanotubes.

An extending plate that is movable to the transparent region is disposed on the surface of the blocking region of the light shielding plate. The light absorption layer is also disposed on a surface of the extending plate. The extending plate is used to selectively increase a light shielding area of the light shielding plate to be adapted to TFT array substrates 100 of different sizes.

For example, a clamping piece is disposed at a margin at an inner side of the light shielding plate. The extending plate is clamped into the clamping piece. Most of the area of the extending plate extends to the transparent region to satisfy demands on UV treatment for small sized TFT array substrates.

For example, one end of the extending plate is hinged at a margin of the blocking region of the light shielding plate. When it is required to increase a light shielding area of the light shielding plate, the extending plate flips to another side to place the extending plate in the transparent region.

In the UV pretreatment apparatus provided in the present disclosure, the light absorption layer is disposed on the inner walls of the chamber of the UV pretreatment apparatus to absorb a part of the UV light. This prevents the UV light from reflecting to the TFT devices of the TFT array substrate via the inner walls of the chamber. Irradiation on the TFT devices by the UV light is avoided. This ensures that electrical properties of the TFT devices will not be affected. In conventional skills, UV treatment on the TFT array substrates will exert an influence on electrical properties of TFT devices of the TFT array substrates, thereby causing a decrease in quality of the TFT array substrates and affecting quality of display panels. The present disclosure can solve this problem.

Above all, while the preferred embodiments of the present disclosure have been illustrated and described in detail, various modifications and alterations can be made by persons skilled in this art. The embodiment of the present disclosure is therefore described in an illustrative but not restrictive sense. It is intended that the present disclosure should not be limited to the particular forms as illustrated, and that all modifications and alterations which maintain the spirit and realm of the present disclosure are within the scope as defined in the appended claims.

The invention claimed is:

1. A ultraviolet (UV) pretreatment apparatus used in vacuum evaporation, comprising:
   a housing having a curing chamber disposed inside the housing;
   a base disposed in the curing chamber and disposed on a bottom face of the curing chamber, configured to support a thin film transistor (TFT) array substrate that is to be processed using UV;
   an inlet disposed at one end of the housing and an outlet disposed at an opposite end of the housing;
   a UV source disposed in the curing chamber; and
   a light absorption layer is disposed on inner walls of the curing chamber;
   wherein the UV source is disposed on a top face of the curing chamber and the light absorption layer is disposed on the bottom face and lateral faces of the curing chamber.

2. The UV pretreatment apparatus according to claim 1, wherein a light shielding plate is disposed in the curing chamber, the light shielding plate is parallel to the bottom face of the curing chamber, four edge portions of the light shielding plate are correspondingly attached to the lateral faces of the curing chamber, the light shielding plate comprises a blocking region and a transparent region located in the blocking region, wherein a length of a long side of the transparent region is equal to a length of a long side of the TFT array substrate, and a length of a short side of the transparent region is equal to a length of a short side of the TFT array substrate.

3. The UV pretreatment apparatus according to claim 2, wherein the lateral faces of the curing chamber are perforated to form sliding chutes, the sliding chutes are perpendicular to the bottom face of the curing chamber, fastening members matching the sliding chutes are disposed at margins of the light shielding plate, and the fastening members slidably connect to the sliding chutes.

4. The UV pretreatment apparatus according to claim 2, wherein the light absorption layer is also disposed on a surface of the blocking region of the light shielding plate.

5. The UV pretreatment apparatus according to claim 2, wherein an extending plate that is movable to the transparent region is disposed on a surface of the blocking region of the light shielding plate.

6. The UV pretreatment apparatus according to claim 5, wherein one end of the extending plate is hinged at a margin of the blocking region of the light shielding plate.

7. The UV pretreatment apparatus according to claim 1, wherein the light absorption layer is fabricated by carbon nanotubes.

8. A ultraviolet (UV) pretreatment apparatus used in vacuum evaporation, comprising:
- a housing having a curing chamber disposed inside the housing;
- a base disposed in the curing chamber and disposed on a bottom face of the curing chamber, configured to support a thin film transistor (TFT) array substrate that is to be processed using UV;
- an inlet disposed at one end of the housing and an outlet disposed at an opposite end of the housing;
- a UV source disposed in the curing chamber; and
- a light absorption layer is disposed on inner walls of the curing chamber.

9. The UV pretreatment apparatus according to claim 8, wherein a light shielding plate is disposed in the curing chamber, the light shielding plate is parallel to the bottom face of the curing chamber, four edge portions of the light shielding plate are correspondingly attached to the lateral faces of the curing chamber, the light shielding plate comprises a blocking region and a transparent region located in the blocking region, wherein a length of a long side of the transparent region is equal to a length of a long side of the TFT array substrate, and a length of a short side of the transparent region is equal to a length of a short side of the TFT array substrate.

10. The UV pretreatment apparatus according to claim 9, wherein the lateral faces of the curing chamber are perforated to form sliding chutes, the sliding chutes are perpendicular to the bottom face of the curing chamber, fastening members matching the sliding chutes are disposed at margins of the light shielding plate, and the fastening members slidably connect to the sliding chutes.

11. The UV pretreatment apparatus according to claim 9, wherein the light absorption layer is also disposed on a surface of the blocking region of the light shielding plate.

12. The UV pretreatment apparatus according to claim 9, wherein an extending plate that is movable to the transparent region is disposed on a surface of the blocking region of the light shielding plate.

13. The UV pretreatment apparatus according to claim 12, wherein one end of the extending plate is hinged at a margin of the blocking region of the light shielding plate.

14. The UV pretreatment apparatus according to claim 8, wherein the light absorption layer is fabricated by carbon nanotubes.

15. A ultraviolet (UV) pretreatment apparatus used in vacuum evaporation, comprising:
- a housing having a curing chamber disposed inside the housing;
- an inlet disposed at one end of the housing and an outlet disposed at an opposite end of the housing;
- a UV source disposed in the curing chamber;
- a base is disposed in the curing chamber, configured to support a thin film transistor (TFT) array substrate that is to be processed using the UV source; and
- a light absorption layer is disposed on inner walls of the curing chamber,
wherein the TFT array substrate comprises:
- a glass substrate;
- a light shielding pattern formed on a surface of the glass substrate;
- a buffer layer fabricated on the surface of the glass substrate and covering the light shielding pattern;
- TFT devices disposed on a surface of the buffer layer and disposed corresponding to the light shielding pattern;
- an insulating layer fabricated on the surface of the buffer layer and covering the TFT devices;
- a passivation layer fabricated on a surface of the insulating layer;
- a flattened layer fabricated on a surface of the passivation layer; and
- an anode metal pattern fabricated on a surface of the flattened layer,
wherein the TFT array substrate is close to the UV source at one side having the anode metal pattern disposed.

* * * * *